(12) United States Patent
Iwashima et al.

(10) Patent No.: US 11,133,406 B2
(45) Date of Patent: Sep. 28, 2021

(54) SEMICONDUCTOR DEVICE

(71) Applicant: DENSO CORPORATION, Kariya (JP)

(72) Inventors: Yayoi Iwashima, Toyota (JP); Yasuhiro Hirabayashi, Tajimi (JP)

(73) Assignee: DENSO CORPORATION, Kariya (JP)

( * ) Notice: Subject to any disclaimer, the term of this patent is extended or adjusted under 35 U.S.C. 154(b) by 188 days.

(21) Appl. No.: 16/290,132

(22) Filed: Mar. 1, 2019

(65) Prior Publication Data
US 2019/0273154 A1 Sep. 5, 2019

(30) Foreign Application Priority Data

Mar. 1, 2018 (JP) .............................. JP2018-036907

(51) Int. Cl.
| | | |
|---|---|---|
| H01L 29/76 | (2006.01) | |
| H01L 29/739 | (2006.01) | |
| H01L 29/417 | (2006.01) | |
| H01L 29/08 | (2006.01) | |
| H01L 29/423 | (2006.01) | |
| H01L 29/10 | (2006.01) | |

(52) U.S. Cl.
CPC ........ *H01L 29/7397* (2013.01); *H01L 29/083* (2013.01); *H01L 29/0804* (2013.01); *H01L 29/0821* (2013.01); *H01L 29/1095* (2013.01); *H01L 29/41708* (2013.01); *H01L 29/4236* (2013.01)

(58) Field of Classification Search
CPC ............. H01L 29/0804; H01L 29/0821; H01L 29/083; H01L 29/1095; H01L 29/41708; H01L 29/0607; H01L 29/0619; H01L 29/0623; H01L 29/0638; H01L 29/7397
See application file for complete search history.

(56) References Cited

U.S. PATENT DOCUMENTS

2003/0205829 A1* 11/2003 Boden, Jr. ........... H01L 29/7802
257/327
2010/0059818 A1 3/2010 Sasaki
2015/0187868 A1* 7/2015 Park ...................... H01L 29/063
257/493
2017/0154833 A1 6/2017 Misumi
2017/0263603 A1* 9/2017 Hata ...................... H01L 29/32

FOREIGN PATENT DOCUMENTS

| JP | 2010-067737 | 3/2010 |
|---|---|---|
| JP | 2016-018848 | 2/2016 |
| JP | 2016-072359 | 5/2016 |

* cited by examiner

*Primary Examiner* — Samuel A Gebremariam
(74) *Attorney, Agent, or Firm* — ObLon, McClelland, Maier & Neustadt, L.L.P.

(57) ABSTRACT

A semiconductor device has a semiconductor substrate that includes an element range and a peripheral range. The semiconductor substrate includes: a body region disposed within the element range; a p-type deep region that is disposed from the element range through the peripheral range, is distributed from an upper surface of the semiconductor substrate to a position deeper than a lower end of each gate trench, and involves end gate trench; and a p-type voltage resistance region that is disposed within the peripheral range, and is distributed from the upper surface to a position shallower than a lower end of the p-type deep region. A p-type impurity concentration within the p-type deep region is increased in the direction from the body region toward the p-type voltage resistance region.

9 Claims, 7 Drawing Sheets

SEMICONDUCTOR DEVICE

INCORPORATION BY REFERENCE

The disclosure of Japanese Patent Application No. 2018-036907 filed on Mar. 1, 2018 including the specification, drawings and abstract is incorporated herein by reference in its entirety.

BACKGROUND

1. Technical Field

The technique disclosed in the present specification relates to a semiconductor device.

2. Description of Related Art

Japanese Patent Application Publication No. 2016-018848 discloses a semiconductor device including an element range and a peripheral range. Within the element range, an insulated gate bipolar transistor (IGBT) is provided. A p-type deep region is provided at a boundary between the element range and the peripheral range. The deep region is distributed from an upper surface of the semiconductor substrate to a position lower than a lower end of each gate trench. The deep region involves the gate trenches located at an end of the element range. By providing the deep region, it is possible to suppress electric fields from being concentrated near the gate trenches located at the end of the element range.

SUMMARY

There has been known a semiconductor device provided with an IGBT and a diode within an element range. Providing such a semiconductor device with the above-described deep region leads a problem that concentrates recovery current of the diode to the deep region. In the present specification, proposed is a semiconductor device that can suppress concentration of electric fields by a deep region, and also suppress concentration of recovery current in the deep region.

A semiconductor device disclosed by the present specification, includes: a semiconductor substrate, an upper electrode, a lower electrode, and gate electrodes. The semiconductor substrate includes an element range where multiple gate trenches are provided on an upper surface of the semiconductor substrate, and a peripheral range provided outward of the element range. The upper electrode is provided on the upper surface of the semiconductor substrate. The lower electrode is provided on a lower surface of the semiconductor substrate. The gate electrode is disposed in each gate trench, and is electrically insulated from the semiconductor substrate by a gate insulating film. The semiconductor substrate includes an emitter region, a body region, a deep region, a voltage resistance region, a drift region, a collector region, and a cathode region. The emitter region is an n-type region that is disposed within the element range, is connected to the upper electrode, and is in contact with the gate insulating film. The body region is a p-type region that is disposed within the element range, and is in contact with the gate insulating film under the emitter region. The deep region is a p-type region that is disposed from the element range through the peripheral range, is distributed from the upper surface to a position deeper than a lower end of each gate trench, and involves end gate trench located closest to the peripheral range among the multiple gate trenches. The voltage resistance region is a p-type region that is disposed within the peripheral range, and is distributed from the upper surface to a position shallower than a lower end of the deep region. The drift region is an n-type region that is disposed from the element range through the peripheral range, is in contact with the gate insulating film under the body region, is separated from the emitter region by the body region, is in contact with the deep region from below, and is in contact with the voltage resistance region from below. The collector region is a p-type region that is disposed under the drift region, and is in contact with the lower electrode. The cathode region is an n-type region that is disposed under the drift region, and is in contact with the lower electrode. A p-type impurity concentration within the deep region is increased in a direction from the body region toward the voltage resistance region.

The p-type impurity concentration within the deep region may be changed in the depth direction. In this case, the p-type impurity concentration at a particular depth in the deep region may be increased in the direction from the body region toward the voltage resistance region.

In this semiconductor device, since the p-type impurity concentration within the deep region is higher on the voltage resistance region side, while the semiconductor device is turned off, an equipotential line is likely to extend in the lateral direction from the element region toward the voltage resistance region. Therefore, electric fields are suppressed from being concentrated near the gate trenches located at the end of the element region. In addition, recovery current of the diode is likely to be concentrated to the deep region near the body region. In the semiconductor device, since the p-type impurity concentration within the deep region is lower on the body region side, the resistance of the deep region located near the body region is higher. Accordingly, current is unlikely to flow through the deep region located near the body region. As a result, the recovery current is suppressed from being concentrated to the deep region.

BRIEF DESCRIPTION OF THE DRAWINGS

Features, advantages, and technical and industrial significance of exemplary embodiments will be described below with reference to the accompanying drawings, in which like numerals denote like elements, and wherein.

DETAILED DESCRIPTION OF EMBODIMENTS

Figure 1:
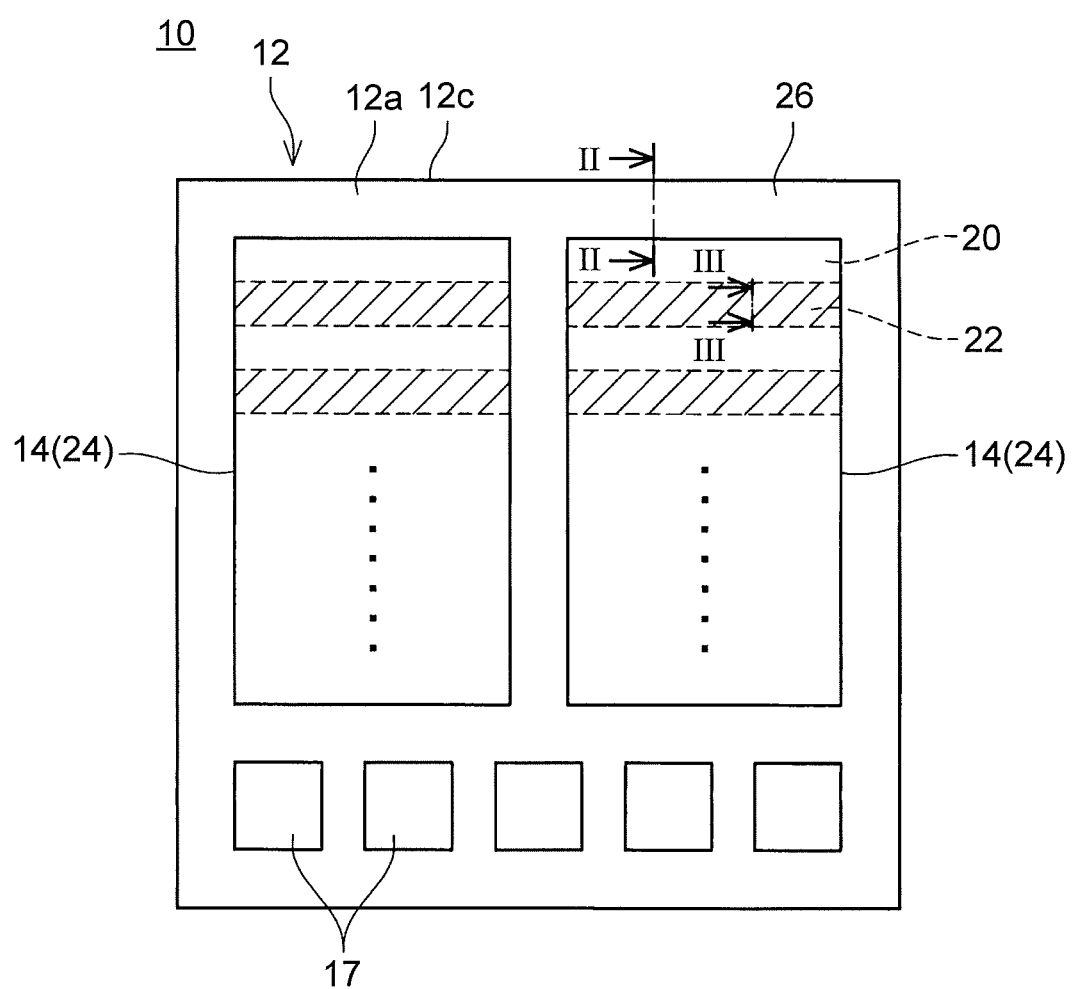
FIG. 1 is a plan view of a semiconductor device 10.

A semiconductor device 10 of an embodiment shown in FIG. 1 includes a semiconductor substrate 12. Two upper electrodes 14 and multiple signal electrodes 17 are provided on an upper surface 12a of the semiconductor substrate 12. The semiconductor substrate 12 includes an IGBT range 20 and a diode range 22 under each upper electrode 14. Note that in FIG. 1, for easier understanding of the drawing, the diode ranges 22 are indicated by oblique line hatching. An IGBT is provided within the IGBT range 20 and a diode is provided within the diode range 22. Hereinafter, the IGBT range 20 as well as the diode range 22 are collectively called as an element range 24. In each element range 24, the IGBT range 20 and the diode range 22 are alternately arranged. A peripheral range 26 is disposed around the respective element ranges 24. The peripheral range 26 is arranged between the element ranges 24 and an outer circumferential end surface 12c of the semiconductor substrate 12. The peripheral range 26 is provided so as to enhance voltage resistance of the semiconductor device 10. In the following description, a side closer to the outer circumferential end surface 12c is referred to as an outer circumferential side, and a side opposite to this side (a side further apart from the outer circumferential end surface 12c) is referred to as an inner circumferential side.

Figure 2:
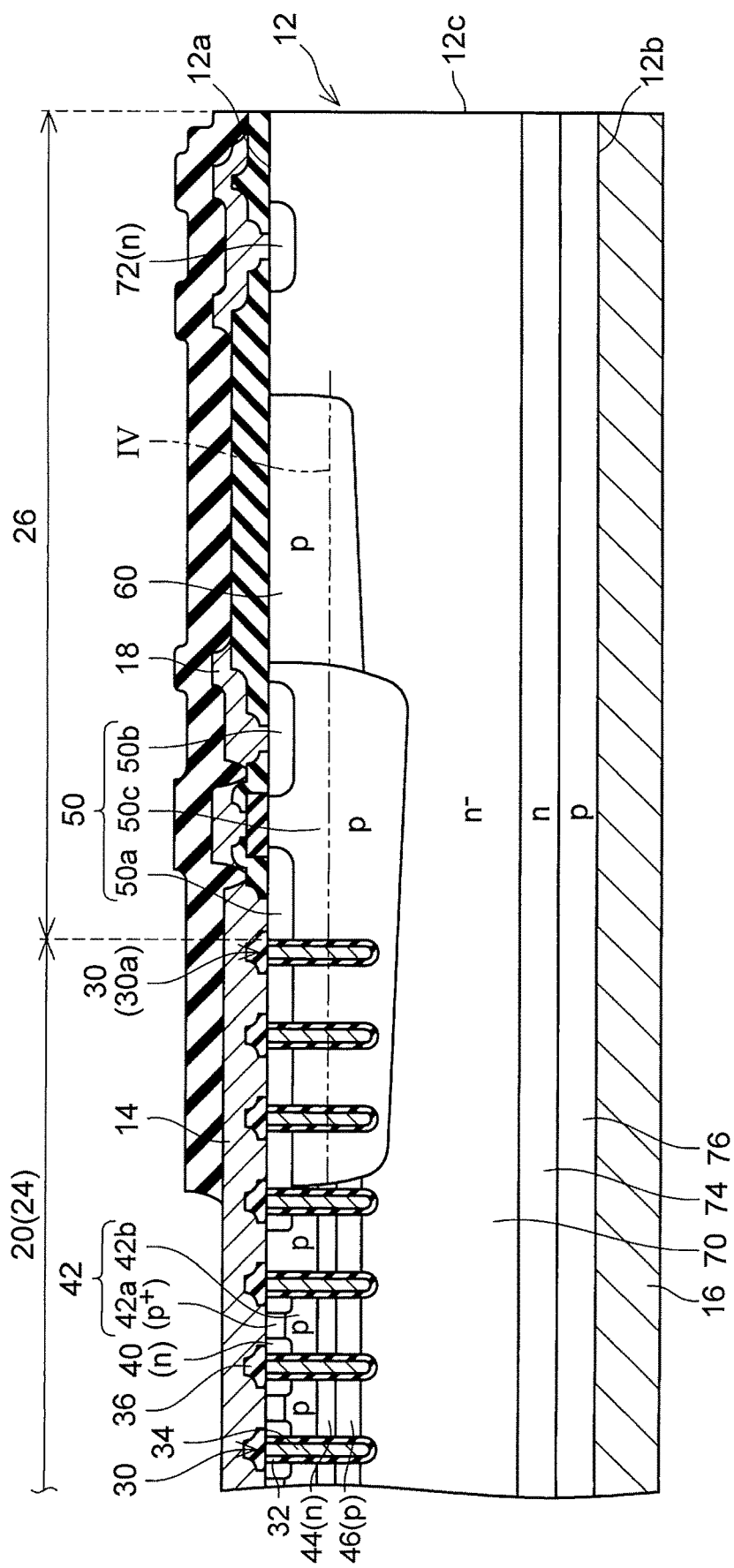
FIG. 2 is a sectional view taken along a line II-II of FIG. 1.
Figure 3:
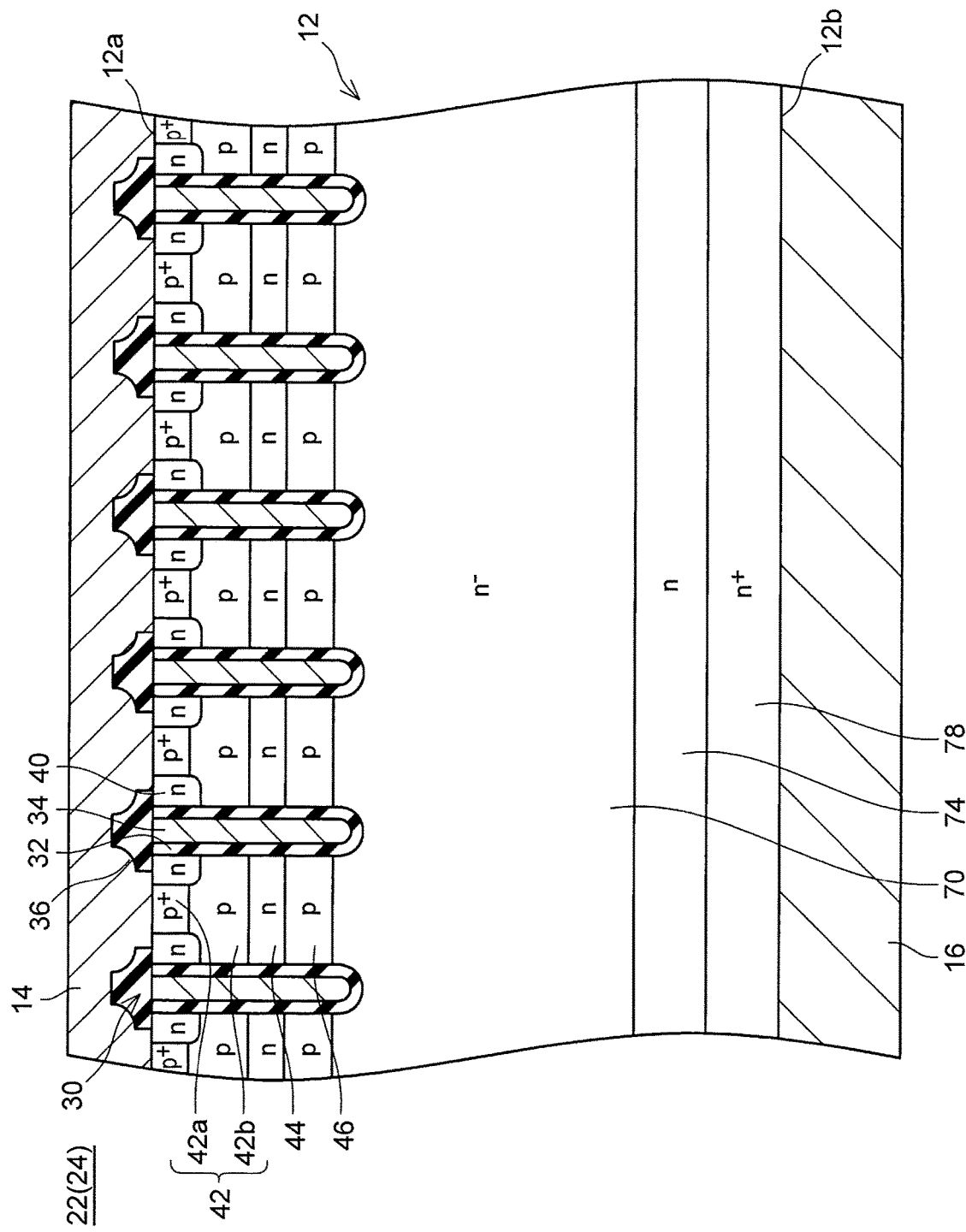
FIG. 3 is a sectional view taken along a line III-III of FIG. 1.

As shown in FIGS. 2, 3, a lower electrode 16 is provided on a lower surface 12b of the semiconductor substrate 12. The lower electrode 16 covers the entire lower surface 12b of the semiconductor substrate 12.

As shown in FIGS. 2, 3, multiple gate trenches 30 are arranged with constant intervals in the upper surface 12a of the semiconductor substrate 12 within the element range 24 (i.e. the IGBT range 20 and the diode range 22). The multiple gate trenches 30 extend in parallel to each other. An inner surface of each gate trench 30 is covered with a gate insulating film 32. A gate electrode 34 is disposed in each gate trench 30. The gate electrode 34 is electrically insulated from the semiconductor substrate 12 by the gate insulating film 32. An upper surface of the gate electrode 34 is covered with an inter-layer insulating film 36. The gate electrode 34 is electrically insulated from the upper electrode 14 by the inter-layer insulating film 36.

As shown in FIG. 2, within the IGBT range 20, an emitter region 40, an upper body region 42, a barrier region 44, and a lower body region 46 are provided within each range sandwiched by adjacent gate trenches 30.

The emitter region 40 is an n-type region having a higher n-type impurity concentration. The emitter region 40 is arranged in a range including the upper surface 12a, and is in ohmic contact with the upper electrode 14. The emitter region 40 is in contact with the gate insulating films 32 at upper ends of the gate trenches 30.

The upper body region 42 is a p-type region. The upper body region 42 includes a contact region 42a and a low concentration region 42b. The contact region 42a has a higher p-type impurity concentration than that in the low concentration region 42b. The contact region 42a is arranged in a range including the upper surface 12a, and is in ohmic contact with the upper electrode 14. The low concentration region 42b is disposed under the contact region 42a and the emitter region 40. The low concentration region 42b is in contact with the gate insulating film 32 under the emitter region 40.

The barrier region 44 is an n-type region having a lower n-type impurity concentration, and is arranged under the low concentration region 42b. The barrier region 44 is separated from the emitter region 40 by the upper body region 42. The barrier region 44 is in contact with the gate insulating films 32 under the low concentration region 42b.

The lower body region 46 is a p-type region, and is disposed under the barrier region 44. The lower body region 46 is separated from the upper body region 42 by the barrier region 44. The lower body region 46 is in contact with the gate insulating films 32 under the barrier region 44.

A deep region 50 is arranged at a boundary between the IGBT range 20 (i.e. element range 24) and the peripheral range 26. The deep region 50 is a p-type region. The deep region 50 is distributed from the upper surface 12a of the semiconductor substrate 12 to a position lower than the lower end of each gate trench 30. The deep region 50 involves the multiple gate trenches 30 that include end gate trench 30a located at an outermost circumferential side (peripheral range 26 side). That is, the deep region 50 involves some gate trenches located on the outer circumferential side, among the multiple gate trenches 30. The deep region 50 is in contact with the gate insulating film 32 on the entire side surfaces as well as the entire bottom surfaces of the multiple gate trenches 30 located on the outer circumferential side. The deep region 50 is adjacent to the upper body region 42, the barrier region 44, and the lower body region 46. The deep region 50 includes contact regions 50a, 50b, and a low concentration region 50c. The contact regions 50a, 50b are provided on an outer surface layer near the upper surface 12a. The contact region 50a is provided in a portion on the inner circumferential side of the deep region 50 (on the upper body region 42 side). The contact region 50a is in ohmic contact with the upper electrode 14. The contact region 50b is provided in a portion on the outer circumferential side of the deep region 50. The contact region 50b is in contact with an electrode 18. The low concentration region 50c is disposed under the contact regions 50a, 50b. The low concentration region 50c is distributed to a position lower than the lower ends of the respective gate trenches 30. The p-type impurity concentration of the low concentration region 50c is lower than p-type impurity concentrations of the contact regions 50a, 50b.

Within the peripheral range 26, a resurf region 60 is provided. The resurf region 60 is a p-type region. The resurf region 60 is disposed within a range including the upper surface 12a of the semiconductor substrate 12. The resurf region 60 is distributed from the upper surface 12a to a position shallower than a lower end of the deep region 50. The resurf region 60 is adjacent to the deep region 50 on the outer circumferential side. When the semiconductor substrate 12 is seen in plan view from above, the resurf region 60 surrounds the periphery of the element range 24.

Figure 4:
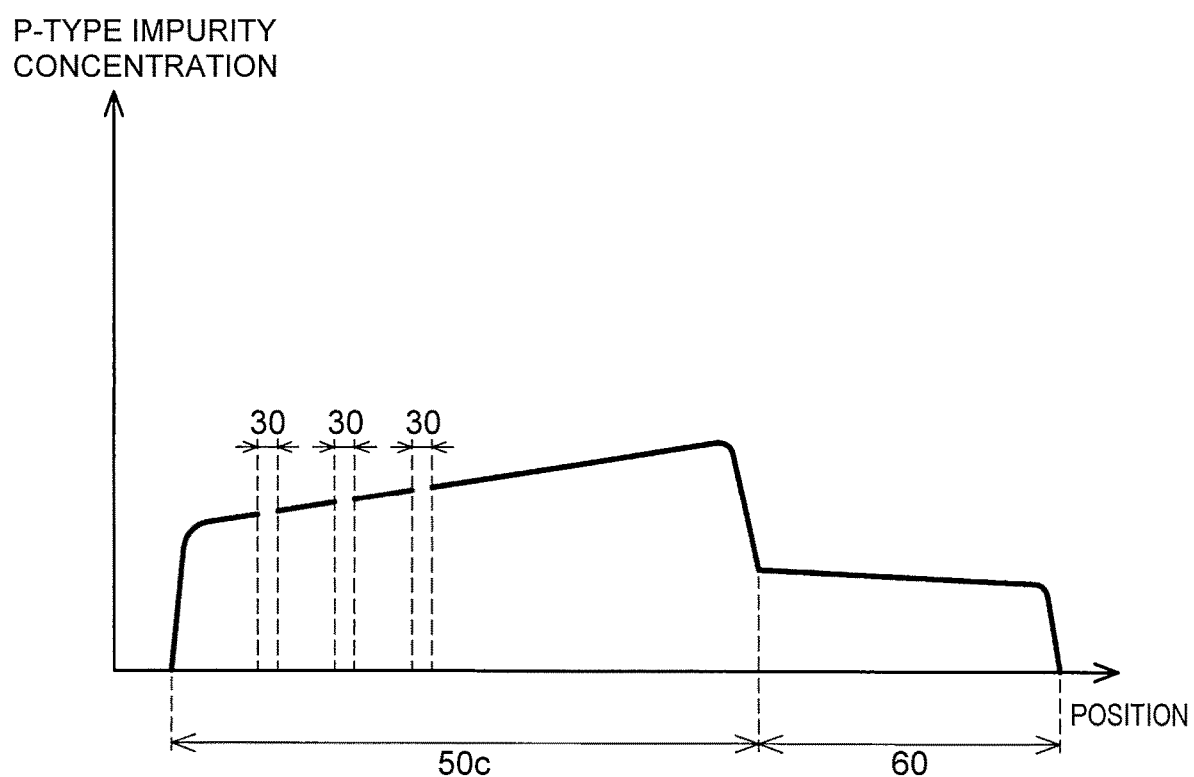
FIG. 4 is a graph showing distributions of a p-type impurity concentration along a straight line IV of FIG. 2.

FIG. 4 shows p-type impurity concentrations within the low concentration region 50c and the resurf region 60, taken along a line IV of FIG. 2. As shown in FIG. 4, the p-type impurity concentration within the low concentration region 50c is continuously increased in a direction from the inner circumferential side (i.e. the upper body region 42 side) toward the outer circumferential side (i.e. the resurf region 60 side). As shown in FIG. 2, the low concentration region 50c becomes deeper in the direction from the inner circumferential side toward the outer circumferential side. This is because, in the manufacturing process of the semiconductor device 10, a diffusion distance of the p-type impurity becomes longer on the outer circumferential side where the p-type impurity concentration is higher than on the inner circumferential side where the p-type impurity concentration is lower. As shown in FIG. 4, the p-type impurity concentration within the resurf region 60 is decreased in the direction from the inner circumferential (low concentration region 50c side) toward the outer circumferential side. A peak value (maximum value) of the p-type impurity concentration within the low concentration region 50c is higher than a peak value (maximum value) of the p-type impurity concentration within the resurf region 60. The peak value of the p-type impurity concentration within the low concentration region 50c is lower than the p-type impurity concentrations within the contact regions 42a, 50a, 50b.

As shown in FIG. 2, a drift region 70 is disposed under the lower body region 46, the deep region 50, and the resurf region 60. The drift region 70 is distributed from the element range 24 throughout the peripheral range 26. The drift region 70 is in contact with the lower body region 46, the deep region 50, and the resurf region 60 from below. The drift region 70 is in contact with the gate insulating films 32 under the lower body region 46. The drift region 70 is in contact with the upper surface 12a of the semiconductor substrate 12 circumferentially outward of the resurf region 60. Within the peripheral range 26, a high-concentration n-type region 72 is disposed at a position apart from the resurf region 60. The high-concentration n-type region 72 has a higher n-type impurity concentration than that in the drift region 70. The high-concentration n-type region 72 is disposed within a range including the upper surface 12a. The high-concentration n-type region 72 is separated from the resurf region 60 by the drift region 70.

A buffer region 74 is arranged under the drift region 70. The buffer region 74 is an n-type region having a higher n-type impurity concentration than that in the drift region 70. The buffer region 74 is distributed from the element range 24 throughout the peripheral range 26. The buffer region 74 is in contact with the drift region 70 from below.

A collector region 76 is arranged within a range including the lower surface 12b of the semiconductor substrate 12. The collector region 76 is a p-type region having a higher p-type impurity concentration. The collector region 76 is in ohmic contact with the lower electrode 16. The collector region 76 is distributed from the IGBT range 20 throughout the peripheral range 26. The collector region 76 is in contact with the buffer region 74 from below.

Within the IGBT range 20, the IGBT is formed by the emitter region 40, the upper body region 42, the barrier region 44, the lower body region 46, the drift region 70, the buffer region 74, the collector region 76, the gate electrode 34, and others. When the IGBT operates, the upper electrode 14 functions as an emitter electrode, and the lower electrode 16 functions as a collector electrode. When the electric potential of the gate electrode 34 is increased up to a value not less than a gate threshold, a channel is generated in the upper body region 42 and the lower body region 46. In this state, when the electric potential of the lower electrode 16 becomes higher than the electric potential of the upper electrode 14, current flows from the emitter region 40, via the channel of the upper body region 42, the barrier region 44, a channel of the lower body region 46, the drift region 70, and the buffer region 74, to the collector region 76. When the electric potential of the gate electrode 34 is decreased down to a value less than the gate threshold value, the channels disappear, so that electron flows are stopped. In this manner, the IGBT performs switching depending on the electric potential of the gate electrode 34.

As shown in FIG. 3, within the diode range 22, a cathode region 78 is provided within a range including the lower surface 12b. The cathode region 78 is an n-type region having a higher n-type impurity concentration than that in the buffer region 74. The cathode region 78 is in ohmic contact with the lower electrode 16. The cathode region 78 is in contact with the buffer region 74 from below. Except that the cathode region 78 is provided instead of the collector region 76, the structure of the diode range 22 is the same as the structure of the IGBT range 20.

Within the diode range 22, a diode is formed by the upper body region 42, the barrier region 44, the lower body region 46, the drift region 70, the buffer region 74, the cathode region 78, and others. When the diode operates, the upper electrode 14 functions as an anode electrode, and the lower electrode 16 functions as a cathode electrode. When the electric potential of the upper electrode 14 is increased higher than the electric potential of the lower electrode 16, current flows from the upper body region 42, via the barrier region 44, the lower body region 46, the drift region 70, and the buffer region 74, to the cathode region 78. Since the n-type impurity concentration within the barrier region 44 is low, the current flows through the barrier region 44. When the electric potential of the upper electrode 14 is decreased lower than the electric potential of the lower electrode 16, the current is stopped.

Next, potential distributions when the IGBT is turned off will be described. When the IGBT is turned off in a state in which the electric potential of the lower electrode 16 is higher than the electric potential of the upper electrode 14, reverse voltage is applied to a p-n junction at a boundary between the lower body region 46 and the drift region 70. Hence, a depletion layer spreads from the lower body region 46 to the drift region 70. In this state, a depletion layer spreads from the deep region 50 to the drift region 70. Furthermore, a depletion layer spreads from the resurf region 60 to the drift region 70. The resurf region 60 encourages the spread of the depletion layer in the drift region 70 located circumferentially outward of the resurf region 60. Accordingly, the drift region 70 is depleted in a wide range.

Figure 5:
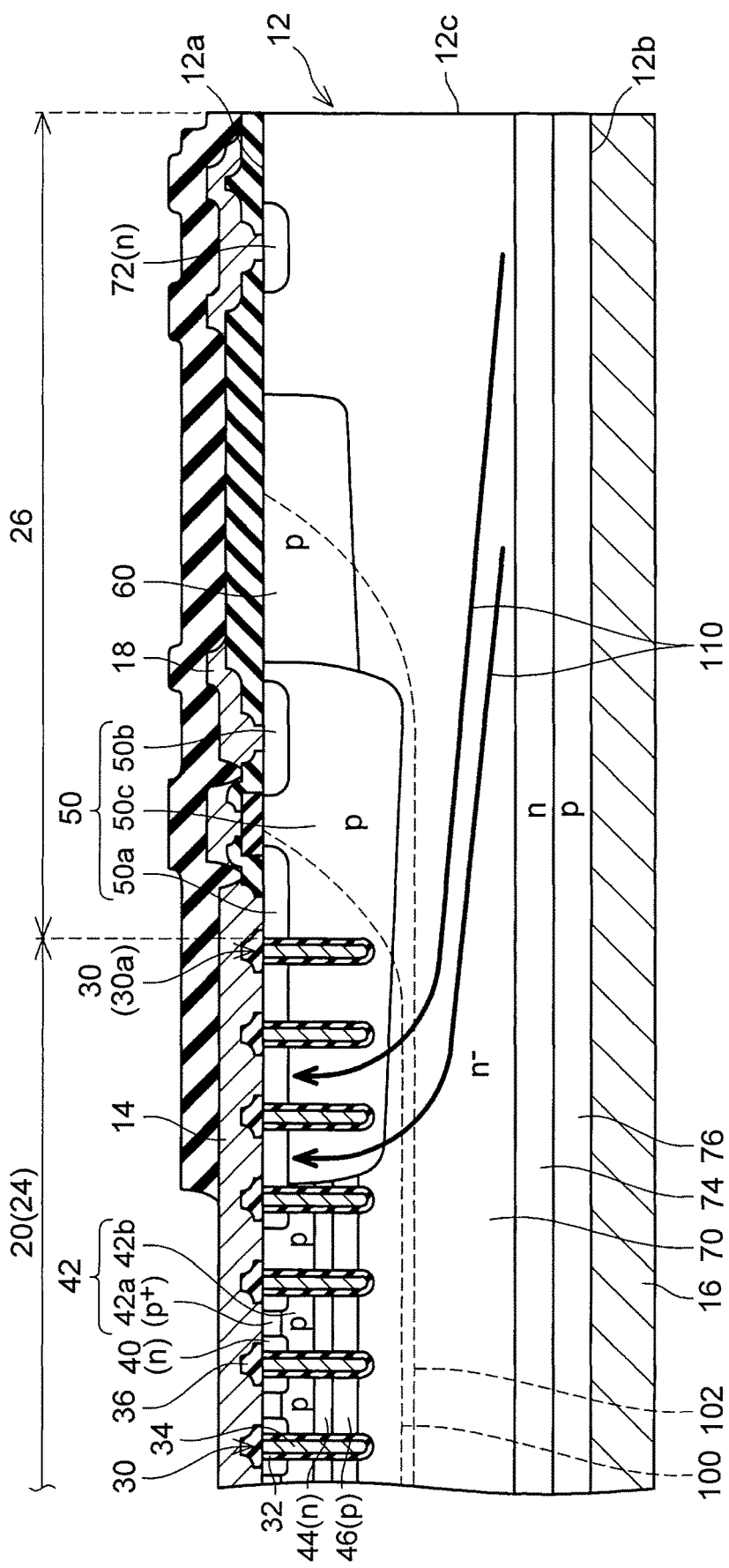
FIG. 5 shows electric potential distributions and a path of recovery current in the same section of FIG. 2.

As indicated by a broken line 100 in FIG. 5, in the state in which the IGBT is turned off, when an equipotential line enters the deep region 50 from the drift region 70, an electric field concentration occurs near the lower end of the end gate trench 30a. However, in the present embodiment, the equipotential line is unlikely to enter the deep region 50. That is, in the present embodiment, the p-type impurity concentration is high in a portion of the deep region 50, the portion located on the outer circumferential side. Hence, as indicated by a broken line 102, the equipotential line is likely to extend toward the outer circumferential side. Accordingly, even if the p-type impurity concentration is lower in a portion of the deep region 50, the portion located on the inner circumferential side, entry of the equipotential line into the deep region 50, as indicated by the broken line 100, is unlikely to occur. Accordingly, in the semiconductor device 10, the electric field concentration near the lower ends of the gate trenches 30a is suppressed.

Next, recovery operation of the diode will be described. As aforementioned, by setting the electric potential of the upper electrode 14 to be higher than the electric potential of the lower electrode 16, the diode is turned on. Then, holes flow from the lower body region 46 into the drift region 70. As a result, electric resistance of the drift region 70 becomes decreased due to the conductivity modulation phenomenon, and electrons thus can pass through the drift region 70 with a lower loss. At this time, the holes are distributed substantially throughout the drift region 70. Thereafter, when the electric potential of the upper electrode 14 is decreased lower than the electric potential of the lower electrode 16, the diode is turned off. When the diode is turned off, the holes distributed in the drift region 70 are discharged to the upper electrode 14. Hence, at the moment when the diode is turned off, reverse current (recovery current) flows through the diode. As aforementioned, in the state in which the diode is turned on, since the holes are present substantially throughout the drift region 70, the holes are also present in the drift region 70 within the peripheral range 26. In the recovery operation of the diode, some of the holes present in the drift region 70 within the peripheral range 26 are discharged through the deep region 50 to the upper electrode 14. At this time, as indicated by arrows 110 in FIG. 5, flows of the holes (i.e. recovery current) are likely to be concentrated to portion of the deep region 50, the portions located on the inner circumferential side closer to the upper electrode 14. However, in the semiconductor device 10, since the p-type impurity concentration in the portion on the inner circumferential side of the deep region 50 is lower, the portion on the inner circumferential side of the deep region 50 has a higher electric resistance. Therefore, the recovery current flowing via the portion on the inner circumferential side of the deep region 50, indicated by the arrows 110, is suppressed. Accordingly, the recovery current is suppressed from being concentrated to the deep region 50.

As aforementioned, according to the semiconductor device 10 of the present embodiment, it is possible to suppress the electric field concentration near the end gate trench 30a while the IGBT is turned off, and suppress the recovery current from being concentrated to the deep region 50 during the recovery operation of the diode.

The deep region 50 in which the p-type impurity concentration is gradually increased in the direction from the inner circumferential side toward the outer circumferential side, for example, may be formed in the following manner. First, a mesh mask is formed in an upper portion of a range where the deep region 50 is to be formed. The mesh mask is a mask having a number of fine apertures. Here, the mask is formed such that a ratio of the apertures becomes smaller on the inner circumferential side and higher on the outer circumferential side. Next, the p-type impurity is implanted into the semiconductor substrate through the mask. Because the ratio of the apertures is greater on the outer circumferential side than on the inner circumferential side, the p-type impurity is implanted such that the p-type impurity concentration becomes higher on the outer circumferential side than on the inner circumferential side. Thereafter, the semiconductor substrate is annealed so as to diffuse and activate the implanted p-type impurity. With this, the deep region 50 in which the p-type impurity concentration is gradually increased in the direction from the inner circumferential side toward the outer circumferential side can be formed.

Figure 6:
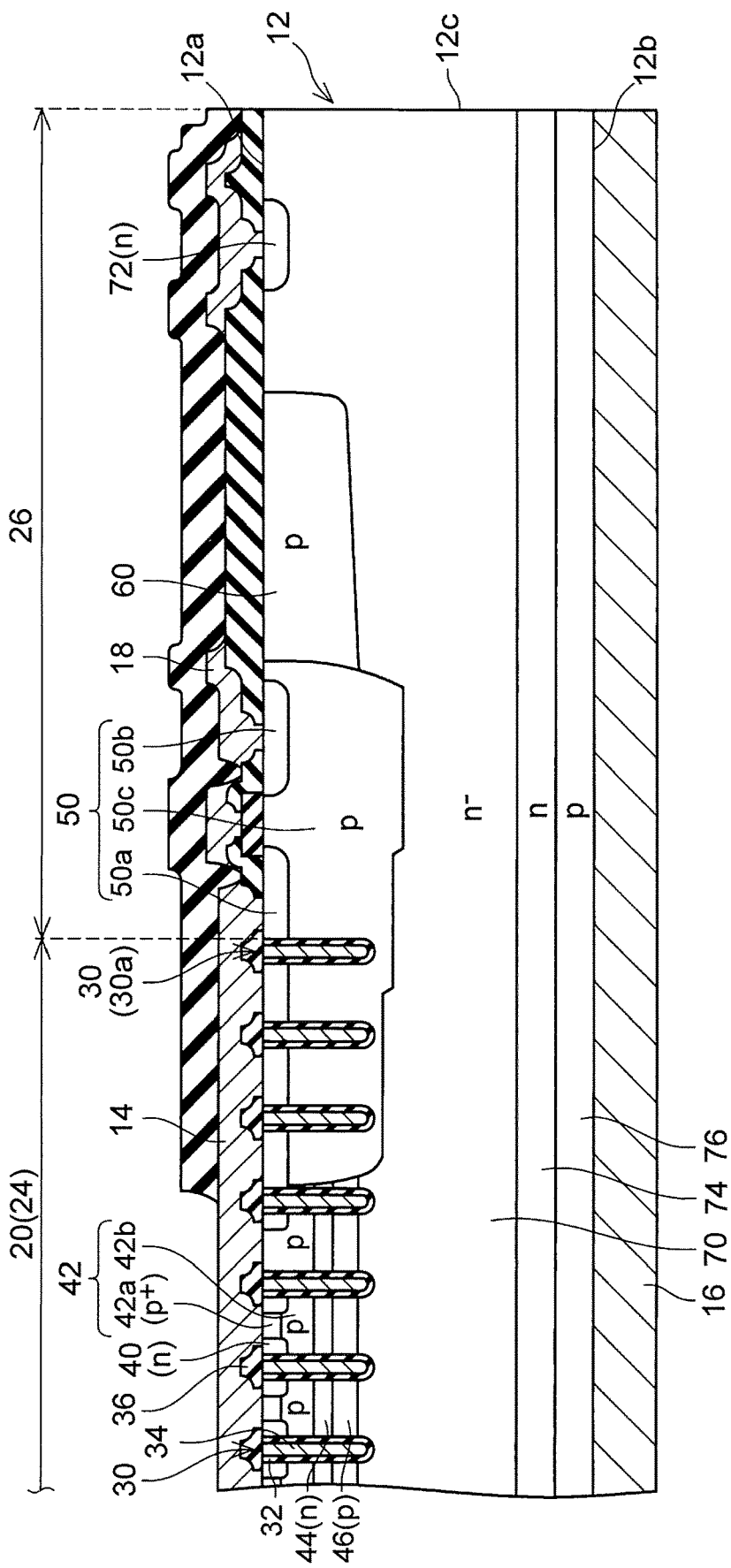
FIG. 6 is a sectional view corresponding to FIG. 2 of the semiconductor device of a variation.

In the aforementioned embodiment, the p-type impurity concentration within the deep region 50 is continuously increased in the direction from the inner circumferential side toward the outer circumferential side. However, the p-type impurity concentration within the deep region 50 may be increased in a stepwise manner in the direction from the inner circumferential side toward the outer circumferential side. In this case, as shown in FIG. 6, the deep region 50 becomes deeper in a stepwise manner in the direction from the inner circumferential side toward the outer circumferential side.

Figure 7:
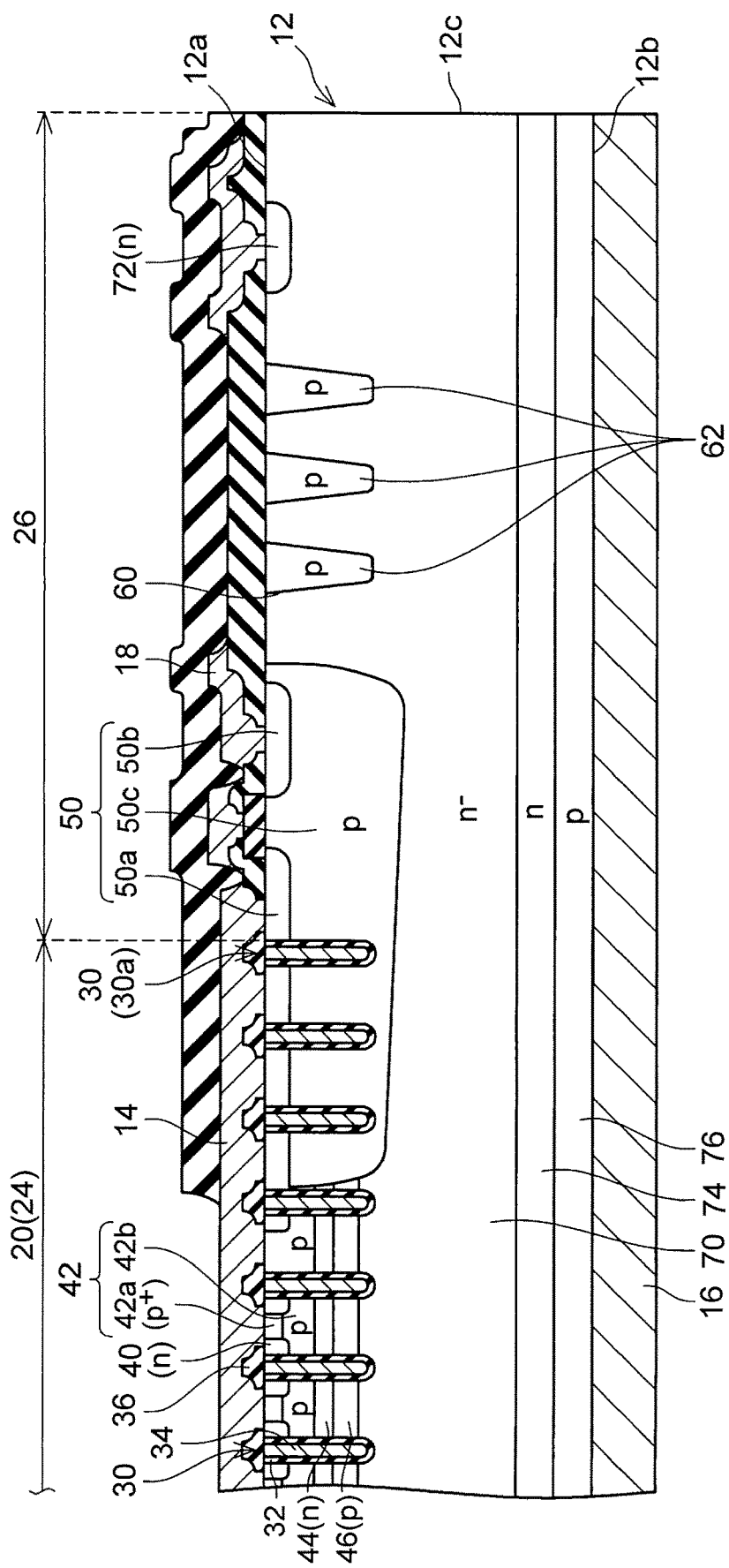
FIG. 7 is a sectional view corresponding to FIG. 2 of the semiconductor device of a variation.

In the aforementioned embodiment, the resurf region 60 is provided on the outer circumferential side of the deep region 50. However, as shown in FIG. 7, instead of the resurf region 60, a guard ring or rings 62 (so-called FLR: field limiting ring) may be provided on the outer circumferential side of the deep region 50. The guard rings 62 are a p-type region. The guard rings 62 are arranged within a range including the upper surface 12a, and are separated from the deep region 50. In FIG. 7, multiple guard rings 62 are indicated, and each guard ring 62 is separated from each other. When the semiconductor substrate 12 is seen in plan view from above, each guard ring 62 annularly extends so as to surround the element range 24. In this manner, even if the guard rings 62 are provided instead of the resurf region 60, it is possible to secure the voltage resistance of the semiconductor device 10.

In the aforementioned embodiment, the semiconductor structure on the upper surface 12a side within the diode range 22 (i.e. the emitter region 40, the upper body region 42, the barrier region 44, and the lower body region 46) is equal to the semiconductor structure on the upper surface 12a side within the IGBT range 20. However, the semiconductor structures on the upper surface 12a side of the diode range 22 and of the IGBT range 20 may be different from each other. For example, within the diode range 22, the emitter region 40 and the barrier region 44 may not be present.

In the aforementioned embodiment, the deep region 50 is provided at the boundary between the IGBT range 20 and the peripheral range 26. However, if the diode range 22 and the peripheral range 26 are adjacent to each other via the gate trenches 30, the deep region 50 may be provided at the boundary between the diode range 22 and the peripheral range 26.

In the aforementioned embodiment, the body region is separated into the upper body region 42 and the lower body region 46 by the barrier region 44. However, the barrier region 44 may not be present.

The technical elements disclosed by the present specification are listed below. Each of the following technical elements independently has utility.

In the semiconductor device of one example disclosed by the present specification, the deep region may include the high concentration region disposed within the range including the upper surface of the semiconductor substrate, and the low concentration region that is disposed under the high concentration region, and has a lower p-type impurity concentration than that in the high concentration region. The p-type impurity concentration within the low concentration region may be increased in the direction from the body region side toward the voltage resistance region side.

In the semiconductor device of one example disclosed by the present specification, the peak value of the p-type impurity concentration within the low concentration region may be higher than the peak value of the p-type impurity concentration within the voltage resistance region.

In this manner, by setting the p-type impurity concentration in the low concentration region to be higher to some extent, it is possible to suitably suppress the electric field concentration near the trenches located at the outer circumferential end of the element range.

In the semiconductor device of one example disclosed by the present specification, the voltage resistance region may be a resurf region adjacent to the deep region.

In the semiconductor device of one example disclosed by the present specification, the voltage resistance region may be an annular guard ring or rings separated from the deep region by the drift region, and surrounding the periphery of the element range.

In the semiconductor device of one example disclosed by the present specification, the p-type impurity concentration within the deep region may be continuously increased in the direction from the body region side toward the voltage resistance region side.

In the semiconductor device of one example disclosed by the present specification, the p-type impurity concentration within the deep region may be increased in a stepwise manner in the direction from the body region side toward the voltage resistance region side.

While the embodiments have been described above in detail, these embodiments are merely illustrative and place no limitation on the scope of the claims. The technology described in the scope of the claims also encompasses various changes and modifications to the specific examples exemplified above. The technical elements explained in the present specification or drawings provide technical utility either independently or through various combinations, and are not limited to the combinations described in the claims as filed. Further, the technology illustrated in the present specification or drawings has been exemplified for satisfying multiple objectives simultaneously, and satisfying any one of those objectives gives technical utility to the technology.

What is claimed is:

1. A semiconductor device comprising:
    a semiconductor substrate including an element range where multiple gate trenches are provided on an upper surface of the semiconductor substrate, and a peripheral range provided outside of the element range;
    an upper electrode provided on the upper surface of the semiconductor substrate;
    a lower electrode provided on a lower surface of the semiconductor substrate; and
    gate electrodes each of which is disposed within each gate trench, and each of which is electrically insulated from the semiconductor substrate by a gate insulating film,
    wherein
    the semiconductor substrate includes:
        an n-type emitter region that is disposed within the element range, is connected to the upper electrode, and is in contact with the gate insulating films;
        a p-type body region that is disposed within the element range, and is in contact with the gate insulating films under the n-type emitter region;
        a p-type deep region that is disposed from the element range through the peripheral range, is distributed from the upper surface to a position deeper than a lower end of each gate trench, and involves end gate trench located closest to the peripheral range among the multiple gate trenches;
        a p-type voltage resistance region that is disposed within the peripheral range, and is distributed from the upper surface to a position shallower than a lower end of the p-type deep region;
        an n-type drift region that is disposed from the element range through the peripheral range, is in contact with the gate insulating films under the p-type body region, is separated from the n-type emitter region by the p-type body region, is in contact with the p-type deep region from below, and is in contact with the p-type voltage resistance region from below;
        a p-type collector region that is disposed under the n-type drift region, and is in contact with the lower electrode; and
        an n-type cathode region that is disposed under the n-type drift region, and is in contact with the lower electrode,
    and
    a p-type impurity concentration within the p-type deep region is increased in a direction from the p-type body region toward the p-type voltage resistance region.

2. The semiconductor device according to claim 1, wherein
    the p-type deep region includes: a high concentration region disposed within a range including the upper surface and a low concentration region that is disposed under the high concentration region, and has a p-type impurity concentration lower than a p-type impurity concentration in the high concentration region, and
    the p-type impurity concentration within the low concentration region is increased in the direction from the p-type body region toward the p-type voltage resistance region.

3. The semiconductor device according to claim 2, wherein
    a maximum value of the p-type impurity concentration within the low concentration region is higher than a maximum value of a p-type impurity concentration within the p-type voltage resistance region.

4. The semiconductor device according to claim 1, wherein the p-type voltage resistance region is a resurf region adjacent to the p-type deep region.

5. The semiconductor device according to claim 1, wherein the p-type voltage resistance region is an annular guard ring that is separated from the p-type deep region by the n-type drift region, and surrounds a periphery of the element range.

6. The semiconductor device according to claim 1, wherein the p-type impurity concentration within the p-type deep region is continuously increased in the direction from the p-type body region toward the p-type voltage resistance region.

7. The semiconductor device according to claim 1, wherein the p-type impurity concentration within the p-type deep region is increased in a stepwise manner in the direction from the p-type body region toward the p-type voltage resistance region.

8. The semiconductor device according to claim I. wherein the p-type deep region is asymmetrical.

9. The semiconductor device according to claim wherein the p-type deep region increases in size in a direction from the p-type body region toward the p-type voltage resistance region.

* * * * *